(12) United States Patent
Ota et al.

(10) Patent No.: US 11,776,448 B2
(45) Date of Patent: Oct. 3, 2023

(54) LIGHT EMITTING DIODE, MANUFACTURING METHOD OF LIGHT EMITTING DIODE AND DISPLAY DEVICE INCLUDING LIGHT EMITTING DIODE

(71) Applicant: SAMSUNG ELECTRONICS CO., LTD., Suwon-si (KR)

(72) Inventors: Jitsuo Ota, Suwon-si (KR); Jihoon Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 397 days.

(21) Appl. No.: 16/844,253

(22) Filed: Apr. 9, 2020

(65) Prior Publication Data
US 2020/0327844 A1 Oct. 15, 2020

(30) Foreign Application Priority Data

Apr. 10, 2019 (KR) ........................ 10-2019-0041898

(51) Int. Cl.
*G09G 3/20* (2006.01)
*G09G 3/32* (2016.01)
(Continued)

(52) U.S. Cl.
CPC ............ *G09G 3/2007* (2013.01); *G09G 3/32* (2013.01); *H01L 25/0753* (2013.01);
(Continued)

(58) Field of Classification Search
None
See application file for complete search history.

(56) References Cited

U.S. PATENT DOCUMENTS 9,780,260 B2 10/2017 Hwang et al.
9,978,808 B2 5/2018 Schneider, Jr. et al.
(Continued)

FOREIGN PATENT DOCUMENTS

CN 103325899 A 9/2013
JP 2875437 B2 3/1999
(Continued)

OTHER PUBLICATIONS

International Search Report (PCT/ISA/210) issued by the International Searching Authority in International Application No. PCT/KR2020/004799, dated Jul. 14, 2020.
(Continued)

*Primary Examiner* — Patrick N Edouard
*Assistant Examiner* — Peijie Shen
(74) *Attorney, Agent, or Firm* — Sughrue Mion, PLLC

(57) ABSTRACT

The disclosure relates to a light emitting diode (LED) that is capable of emitting a plurality of lights having different wavelengths from one another, and independently controlling the intensity of the plurality of emitted lights and a manufacturing method of the LED, and a display device including the LED. Specifically, an LED according to the disclosure includes a first light emitting cell including an n-type semiconductor layer, a p-type semiconductor layer, and a first light emitting layer which respectively include at least one non-planar area, the first light emitting layer emitting a light of a first wavelength, a second light emitting cell including an n-type semiconductor layer, a p-type semiconductor layer, and a second light emitting layer which respectively consist of a planar area, the second light emitting layer emitting a light of a second wavelength different from the first wavelength of the light emitted from the first light emitting layer, a common electrode commonly connected with the first light emitting cell and the second light (Continued)

emitting cell, and a first pixel electrode and a second pixel electrode independently connected with each of the first light emitting cell and the second light emitting cell.

8 Claims, 12 Drawing Sheets

(51) Int. Cl.
    *H01L 25/075*     (2006.01)
    *H01L 27/12*     (2006.01)
    *H01L 27/15*     (2006.01)
    *H01L 33/00*     (2010.01)
    *H01L 33/18*     (2010.01)
    *H01L 33/24*     (2010.01)
    *H01L 33/32*     (2010.01)
    *H01L 33/38*     (2010.01)
    *H01L 33/44*     (2010.01)

(52) U.S. Cl.
    CPC .......... *H01L 27/1214* (2013.01); *H01L 27/15* (2013.01); *H01L 33/007* (2013.01); *H01L 33/18* (2013.01); *H01L 33/24* (2013.01); *H01L 33/32* (2013.01); *H01L 33/38* (2013.01); *H01L 33/44* (2013.01); *G09G 2330/10* (2013.01); *H01L 2933/0016* (2013.01); *H01L 2933/0025* (2013.01)

(56) References Cited

U.S. PATENT DOCUMENTS

| | | | |
|---|---|---|---|
| 2003/0107047 A1* | 6/2003 | Okuyama | H01L 21/02609 257/95 |
| 2005/0045894 A1* | 3/2005 | Okuyama | H01L 33/24 257/95 |
| 2009/0127570 A1* | 5/2009 | Tamai | B82Y 20/00 257/89 |
| 2013/0248817 A1* | 9/2013 | Kim | H01L 33/24 977/700 |
| 2014/0159071 A1* | 6/2014 | Choi | H01L 27/15 257/88 |
| 2014/0203240 A1* | 7/2014 | Hwang | H01L 33/08 257/13 |
| 2015/0221820 A1* | 8/2015 | Kim | H01L 33/24 257/13 |
| 2015/0340557 A1* | 11/2015 | Turcotte | H01L 33/20 257/98 |
| 2015/0364590 A1* | 12/2015 | Ohno | H01L 29/0657 257/194 |
| 2016/0181477 A1* | 6/2016 | Lee | H01L 33/42 257/98 |
| 2018/0277717 A1* | 9/2018 | Amstatt | H01L 33/08 |
| 2018/0277727 A1* | 9/2018 | Diana | H01L 33/46 |
| 2020/0212102 A1* | 7/2020 | Park | H01L 33/62 |

FOREIGN PATENT DOCUMENTS

| | | |
|---|---|---|
| JP | 2910023 B2 | 6/1999 |
| KR | 10-0413803 B1 | 4/2004 |
| KR | 10-2014-0093433 A | 7/2014 |
| KR | 10-2018-0118090 A | 10/2018 |

OTHER PUBLICATIONS

Written Opinion (PCT/ISA/237) issued by the International Searching Authority in International Application No. PCT/KR2020/004799, dated Jul. 14, 2020.

M. Funato et al., "Tailored emission color synthesis using microfacet quantum wells consisting of nitride semiconductors without phosphors", Applied Physics Letters, vol. 88, No. 26, 261920, 2006, 4 pages.

* cited by examiner

111

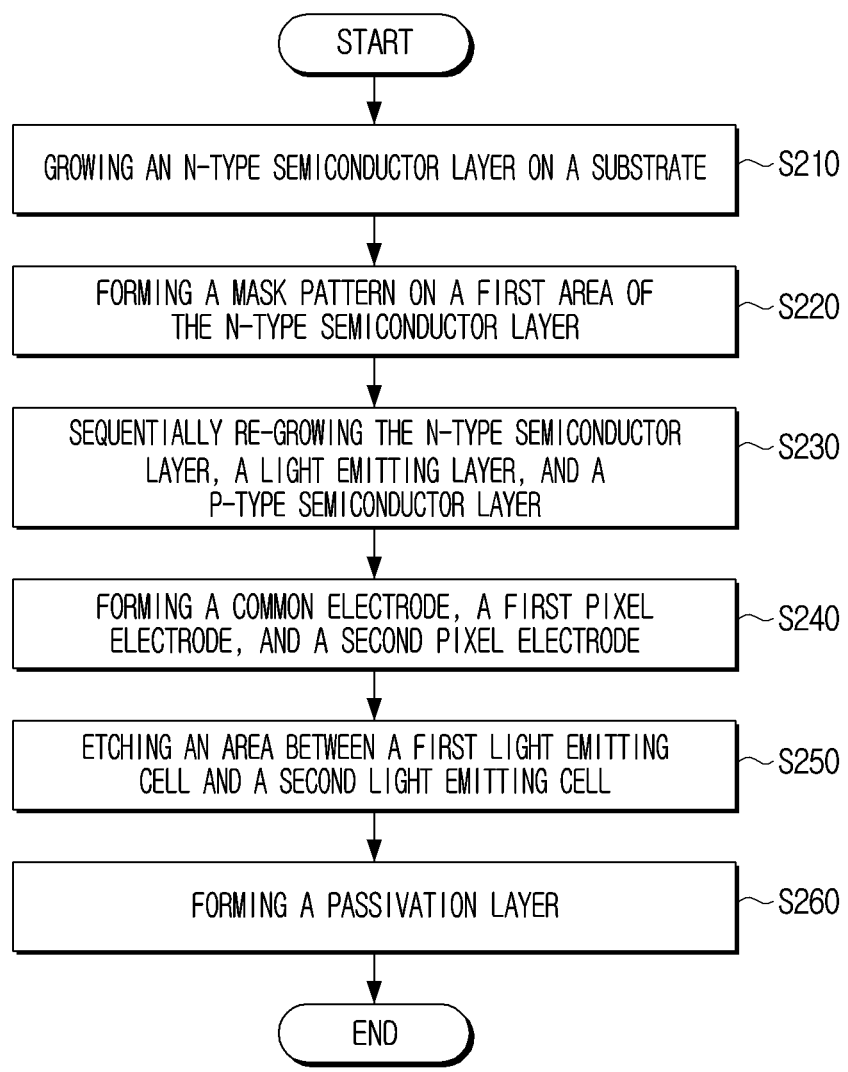

LIGHT EMITTING DIODE, MANUFACTURING METHOD OF LIGHT EMITTING DIODE AND DISPLAY DEVICE INCLUDING LIGHT EMITTING DIODE

CROSS-REFERENCE TO RELATED APPLICATION(S)

This application is based on and claims priority under 35 U.S.C. § 119(a) of a Korean patent application number 10-2019-0041898, filed on Apr. 10, 2019 in the Korean Intellectual Property Office, the disclosure of which is incorporated by reference herein in its entirety.

BACKGROUND

1. Field

The disclosure relates to an LED and a manufacturing method of the LED, and a display device including the LED, and more particularly, to an LED that is capable of emitting a plurality of lights having different wavelengths from one another and a manufacturing method of the LED, and a display device including the LED.

2. Description of Related Art

Recently, LEDs based on semiconductors are being commercialized in various fields of industry such as the field of displays because of their high light emitting efficiency and a long lifespan.

In particular, recently, integrated LEDs that are capable of emitting lights of various colors from one element are gaining attention as LEDs appropriate for manufacture of display devices having the characteristics of low power, high integration, and high resolution. Specifically, there is a rising need for LEDs that are capable of emitting a plurality of lights having different wavelengths from one another, and independently controlling the intensity of the plurality of emitted lights, and at the same time, which can be manufactured effectively by a low cost process.

Meanwhile, a micro LED (mLED or μLED) display panel is a kind of flat display panel and may include a plurality of inorganic light emitting diodes (inorganic LEDs), each of which is in a size of smaller than 100 micrometers. Compared to a liquid crystal display (LCD) panel which needs a backlight, a micro LED display panel provides better contrast, response time, and energy efficiency. Also, while both of an organic light emitting diode (organic LED) and a micro LED have good energy efficiency, a micro LED has an advantage that it has better brightness and light emitting efficiency, and a longer lifespan than an OLED.

SUMMARY

The disclosure was devised according to the aforementioned need, and the disclosure is to provide an LED that is capable of emitting a plurality of lights having different wavelengths from one another, and independently controlling the intensity of the plurality of emitted lights and a manufacturing method of the LED, and a display device including the LED.

According to an embodiment of the disclosure, a light emitting diode (LED) includes a first light emitting cell including a first n-type semiconductor layer, a first p-type semiconductor layer, and a first light emitting layer which respectively include at least one non-planar area, the first light emitting layer emitting a light of a first wavelength, a second light emitting cell including a second n-type semiconductor layer, a second p-type semiconductor layer, and a second light emitting layer which respectively include a planar area, the second light emitting layer emitting a light of a second wavelength different from the first wavelength of the light emitted from the first light emitting layer, a common electrode commonly connected with the first light emitting cell and the second light emitting cell, and a first pixel electrode and a second pixel electrode independently connected with each of the first light emitting cell and the second light emitting cell.

Here, the first n-type semiconductor layer and the second n-type semiconductor layer may be n-GaN (gallium nitride) layers, the first p-type semiconductor layer and the second p-type semiconductor layer may be p-GaN layers, and the first light emitting layer and the second light emitting layer may include InGaN (Indium gallium nitride) having different composition ratios of In from each other.

Here, the composition ratios of In of InGaN included in each of the first light emitting layer and the second light emitting layer may be determined differently according to the difference of the incorporation rates of In for the n-GaN layer including at least one non-planar area and the n-GaN layer including a planar area.

Here, the LED may further include a mask pattern formed inside the n-type semiconductor layer, and the at least one non-planar area included in each of the first n-type semiconductor layer, the first p-type semiconductor layer, and the first light emitting layer included in the first light emitting cell may be formed on a window area of the mask pattern.

Meanwhile, the first light emitting cell and the second light emitting cell may be divided horizontally by an etched area between the first light emitting cell and the second light emitting cell.

Here, the LED may further include a passivation layer formed on an area excluding the areas where the common electrode, the first pixel electrode, and the second pixel electrode are formed.

Meanwhile, the LED may further include a third light emitting cell including a third n-type semiconductor layer, a third p-type semiconductor layer, and a third light emitting layer which respectively include at least one non-planar area, and a third pixel electrode independently connected with the third light emitting cell. Also, the non-planar area included in the third light emitting cell may be different from the non-planar area included in the first light emitting cell, the third light emitting layer may emit a light of a third wavelength from the first wavelength of the light emitted from the first light emitting layer and the second wavelength of the light emitted from the second light emitting layer, and the common electrode may be commonly connected with the first light emitting cell, the second light emitting cell, and the third light emitting cell.

Meanwhile, the at least one non-planar area may include at least one of crystal planes of which Miller indices are {11-22} and {10-11}. When describing a Miller index, a negative coordinate value may be expressed by using an overline, but in describing the disclosure, a negative coordinate value of a Miller index was expressed by adding a negative mark (−) instead of an overline.

Meanwhile, according to an embodiment of the disclosure, a display device includes a display panel including a plurality of light emitting diodes (LEDs), a memory including at least one instruction, and a processor executing the at least one instruction. Also, at least one LED among the plurality of LEDs respectively includes a first light emitting cell including a first n-type semiconductor layer, a first p-type semiconductor layer, and a first light emitting layer which respectively include at least one non-planar area, the first light emitting layer emitting a light of a first wavelength, a second light emitting cell including a second n-type semiconductor layer, a second p-type semiconductor layer, and a second light emitting layer which respectively include a planar area, the second light emitting layer emitting a light of a second wavelength different from the first wavelength of the light emitted from the first light emitting layer, a common electrode commonly connected with the first light emitting cell and the second light emitting cell, and a first pixel electrode and a second pixel electrode independently connected with each of the first light emitting cell and the second light emitting cell.

Here, the display panel may further include a first switching element electronically connected with the first pixel electrode and a second switching element electronically connected with the second pixel electrode. Also, the processor may independently control an operation of the first light emitting cell and an operation of the second light emitting cell through the first switching element and the second switching element.

Here, the processor may, based on a defective pixel occurring in at least one of the first light emitting cell or the second light emitting cell included in the first LED among the plurality of LEDs, control an operation of at least one of the first light emitting cell or the second light emitting cell included in the second LED adjacent to the first LED among the plurality of LEDs.

Meanwhile, according to an embodiment of the disclosure, a manufacturing method of a light emitting diode (LED) includes the steps of growing an n-type semiconductor layer on a substrate, forming a mask pattern on a first area on the n-type semiconductor layer, sequentially re-growing the n-type semiconductor layer, a light emitting layer, and a p-type semiconductor layer, and forming a first light emitting cell including a first n-type semiconductor layer, a first p-type semiconductor layer, and a first light emitting layer which respectively include at least one non-planar area on the first area, and forming a second light emitting cell including a second n-type semiconductor layer, a second p-type semiconductor layer, and a second light which respectively consist of a planar area on a second area different from the first area, the first light emitting layer emitting a light of a first wavelength, and the second light emitting layer emitting layer emitting a light of a second wavelength different from the first wavelength of the light emitted from the first light emitting layer, and forming a common electrode commonly connected with the first light emitting cell and the second light emitting cell, and independently forming a first pixel electrode and a second pixel electrode on each of the first light emitting cell and the second light emitting cell.

Here, the first n-type semiconductor layer and the second n-type semiconductor layer may be n-GaN layers formed by epitaxial growth, the first p-type semiconductor layer and the second p-type semiconductor layer may be p-GaN layers formed by epitaxial growth, and the first light emitting layer and the second light emitting layer may include InGaN having different composition ratios of In from each other.

Here, the composition ratios of In of InGaN included in each of the first light emitting layer and the second light emitting layer may be determined differently according to the difference of the incorporation rates of In for the n-GaN layer including at least one non-planar area and the n-GaN layer including a planar area.

Here, the first n-type semiconductor layer, the first p-type semiconductor layer, and the first light emitting layer included in the first light emitting cell may be formed to include at least one non-planar area by selective area growth through a window area of the mask pattern.

Meanwhile, the manufacturing method of an LED device may further include the step of etching a third area between the first light emitting cell and the second light emitting cell so that the first light emitting cell and the second light emitting cell are divided horizontally.

Here, the manufacturing method of an LED device may further include the step of forming a passivation layer on an area excluding the areas where the common electrode, the first pixel electrode, and the second pixel electrode are formed.

Meanwhile, the at least one non-planar area may include at least one of crystal planes of which Miller indices are {11-22} and {10-11}.

BRIEF DESCRIPTION OF THE DRAWINGS

FIG. 2 is a flow chart for illustrating a manufacturing method of an LED according to an embodiment of the disclosure;

DETAILED DESCRIPTION

Figure 1A:
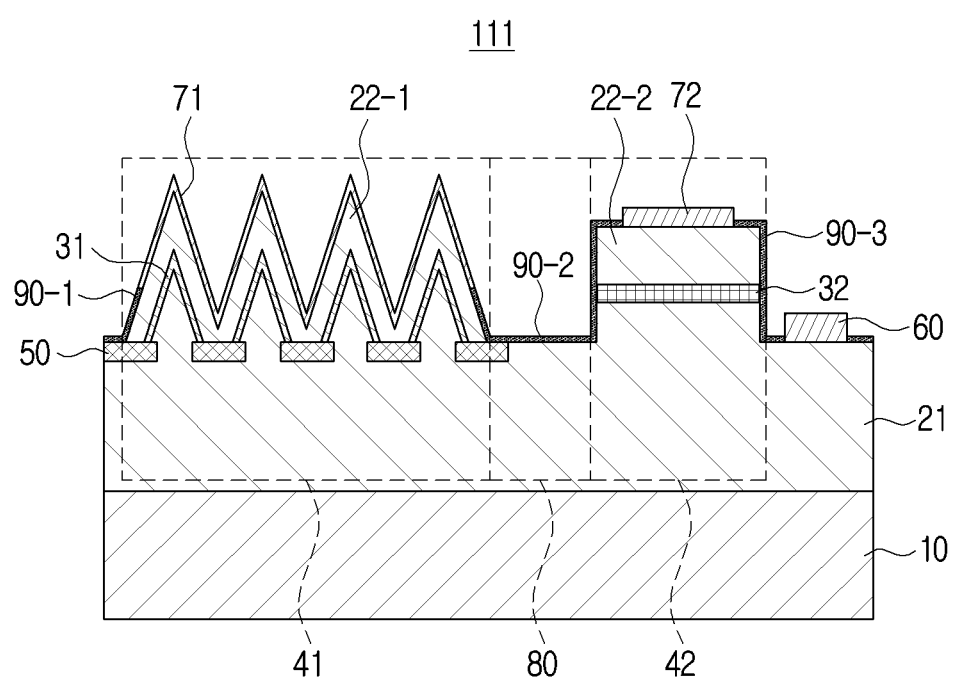
FIG. 1A is a sectional view illustrating a configuration of an LED according to an embodiment of the disclosure.

Various modifications may be made to the embodiments of the disclosure, and there may be various types of embodiments. Accordingly, specific embodiments will be illustrated in drawings, and the embodiments will be described in detail in the detailed description. However, it should be noted that the various embodiments are not for limiting the scope of the disclosure to a specific embodiment, but they should be interpreted to include various modifications, equivalents, and/or alternatives of the embodiments of the disclosure. Also, with respect to the detailed description of the drawings, similar components may be designated by similar reference numerals.

Meanwhile, in describing the disclosure, in case it is determined that detailed explanation of related known functions or components may unnecessarily confuse the gist of the disclosure, the detailed explanation will be omitted.

In addition, the embodiments below may be modified in various different forms, and the scope of the technical idea of the disclosure is not limited to the embodiments below. Rather, these embodiments are provided to make the disclosure more sufficient and complete, and to fully convey the technical idea of the disclosure to those skilled in the art.

The terms used in the disclosure are used just to explain specific embodiments of the disclosure, and are not intended to limit the scope of the disclosure. Also, singular expressions include plural expressions, unless defined obviously differently in the context.

In the disclosure, expressions such as "have," "may have," "include" and "may include" should be construed as denoting that there are such characteristics (e.g., elements such as numerical values, functions, operations and components), and the expressions are not intended to exclude the existence of additional characteristics.

Also, in the disclosure, the expressions "A or B," "at least one of A and/or B," or "one or more of A and/or B" and the like may include all possible combinations of the listed items. For example, "A or B," "at least one of A and B," or "at least one of A or B" may refer to all of the following cases: (1) including at least one A, (2) including at least one B, or (3) including at least one A and at least one B.

In addition, expressions such as "first," "second" and the like used in the disclosure may be used to describe various elements regardless of any order and/or degree of importance. Also, such expressions are used only to distinguish one element from another element, and are not intended to limit the elements.

Meanwhile, the description in the disclosure that one element (e.g., a first element) is "(operatively or communicatively) coupled with/to" or "connected to" another element (e.g., a second element) should be interpreted to include both the case where the one element is directly coupled to the another element, and the case where the one element is coupled to the another element through still another element (e.g., a third element).

In contrast, the description that one element (e.g., a first element) is "directly coupled" or "directly connected" to another element (e.g., a second element) can be interpreted to mean that still another element (e.g., a third element) does not exist between the one element and the another element.

Meanwhile, in the disclosure, "a plane" may mean that any processing was not performed during formation of a non-conductor/semiconductor/conductor layer, and "a non-planar surface" may mean that surface processing was performed so that the surface area becomes bigger than "a plane" during formation of a non-conductor/semiconductor/conductor layer. Also, "a non-planar surface" is not limited to a specific form.

Further, the expression "configured to" used in the disclosure may be interchangeably used with other expressions such as "suitable for," "having the capacity to," "designed to," "adapted to," "made to" and "capable of," depending on cases. Meanwhile, the term "configured to" may not necessarily mean that a device is "specifically designed to" in terms of hardware.

Instead, under some circumstances, the expression "a device configured to" may mean that the device "is capable of" performing an operation together with another device or component. For example, the phrase "a processor configured to perform A, B and C" may mean a dedicated processor (e.g., an embedded processor) for performing the corresponding operations, or a generic-purpose processor (e.g., a CPU or an application processor) that can perform the corresponding operations by executing one or more software programs stored in a memory device.

A display device according to the various embodiments of the disclosure may include, for example, a television, a monitor, a smartphone, a table PC, and a wearable device, and the like.

Meanwhile, various elements and areas in drawings were illustrated schematically. Accordingly, the technical idea of the disclosure is not limited by the relative sizes or intervals drawn in the accompanying drawings.

Hereinafter, the embodiments according to the disclosure will be described in detail with reference to the accompanying drawings, such that those having ordinary skill in the art to which the disclosure belongs can easily carry out the disclosure.

Figure 1B:
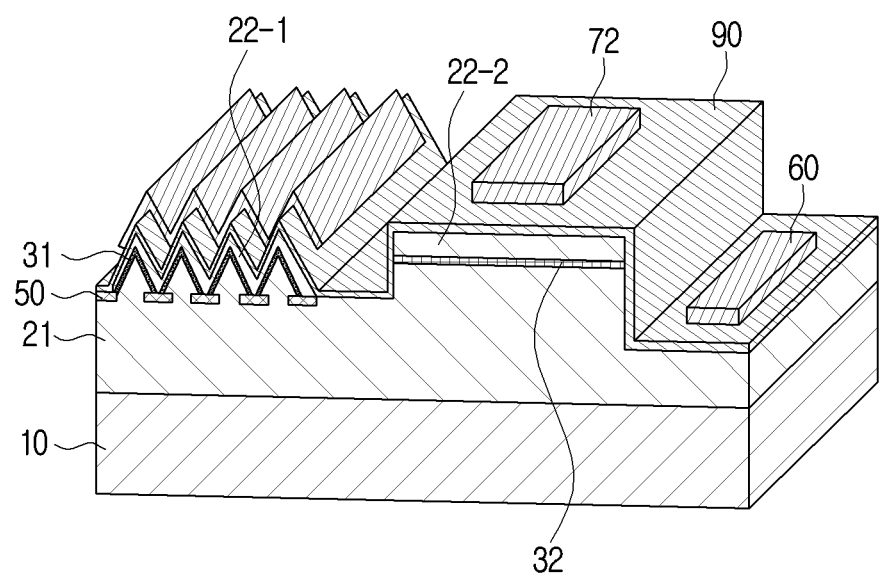
FIG. 1B is a perspective view illustrating a configuration of an LED according to an embodiment of the disclosure.

FIG. 1A is a sectional view illustrating a configuration of an LED according to an embodiment of the disclosure, and FIG. 1B is a perspective view illustrating a configuration of an LED according to an embodiment of the disclosure.

As illustrated in FIGS. 1A and 1B, an LED 111 according to an embodiment of the disclosure includes a first light emitting cell 41, a second light emitting cell 42, a common electrode 60, a first pixel electrode 71, a second pixel electrode 72, a mask pattern 50, and a passivation layer 90-1, 90-2, 90-3. Also, the first light emitting cell 41 includes an n-type semiconductor layer 21, p-type semiconductor layers 22-1, 22-2, and a first light emitting layer 31, and the second light emitting cell 42 includes an n-type semiconductor layer 21, p-type semiconductor layers 22-1, 22-2, and a second light emitting layer 32.

Hereinafter, the first light emitting cell 41 and the second light emitting cell 42 will be generally referred to as light emitting cells when it is not necessary to explain them by distinguishing them. Also, in explaining the first light emitting layer 31 and the second light emitting layer 32, and the first pixel electrode 71 and the second pixel electrode 72, etc. that will be described below, the components will be respectively referred to as light emitting layers and pixel electrodes, etc. in general.

The light emitting layers 31, 32, the n-type semiconductor layer 21, and the p-type semiconductor layers 22-1, 22-2 may consist of various semiconductors having band gaps corresponding to specific areas in a spectrum. For example, a red LED 111 having a light wavelength of 600-750 nm may include one or more layers based on an AlInGaP-base semiconductor. Also, blue and green LEDs 111 respectively having light wavelengths of 450-490 nm and 500-570 nm may include one or more layers based on an AlInGaP-base semiconductor.

The n-type semiconductor layer 21 and the p-type semiconductor layers 22-1, 22-2 may be implemented as compound semiconductors such as the group III-V and the group II-VI. In particular, the n-type semiconductor layer 21 and the p-type semiconductor layers 22-1, 22-2 may be implemented as nitride semiconductor layers. For example, the n-type semiconductor layer 21 and the p-type semiconductor layers 22-1, 22-2 may be an n-GaN semiconductor layer and a p-GaN semiconductor layer, respectively. However, the n-type semiconductor layer 21 and the p-type semiconductor layers 22-1, 22-2 according to the disclosure are not necessarily limited thereto, and they may consist of various materials according to various characteristics required for the LED 111.

An n-type semiconductor is a semiconductor for which free electrons are used as carriers moving electric charges, and they may be created by doping n-type dopants such as Si, Ge, Sn, Te, and the like. Meanwhile, a p-type semiconductor is a semiconductor for which holes are used as carriers moving electric charges, and they may be created by doping p-type dopants such as Mg, Zn, Ca, Ba, and the like.

A light emitting layer is located between the n-type semiconductor layer 21 and the p-type semiconductor layers 22-1, 22-2, and is a layer where electrons which are carriers of the n-type semiconductor layer 21 and holes which are carriers of the p-type semiconductor layers 22-1, 22-2 meet. When electrons and holes meet on the light emitting layer, a potential barrier is formed as the electrons and the holes are re-combined. Then, when the electrons and the holes go beyond the potential barrier and transfer to a low energy level according to an applied voltage, a light of a wavelength corresponding thereto is emitted.

Here, the light emitting layer may be a multi-quantum wells (MQW) structure, but the disclosure is not limited thereto, and the light emitting layer may be various structures such as a single-quantum well (SQW) or quantum dot (QD) structure, and the like. In case the light emitting layer is formed as a multi-quantum wells structure, the well layer/barrier layer of the light emitting layer may be formed as various structures such as InGaN/GaN, InGaN/InGaN, and GaAs(InGaGs)/AlGaAs, but the disclosure is not limited to such structures. Also, the number of quantum wells included in the light emitting layer is not limited to a specific number.

As described above, the n-type semiconductor layer 21, the p-type semiconductor layers 22-1, 22-2, and the light emitting layer according to the disclosure are not limited to specific materials. However, hereinafter, explanation will be made mainly based on an example where the n-type semiconductor layer 21 and the p-type semiconductor layers 22-1, 22-2 are an n-GaN semiconductor layer and a p-GaN semiconductor layer, respectively, and the light emitting layer includes an InGaN well layer.

Meanwhile, the LED 111 according to an embodiment of the disclosure as illustrated in FIG. 1A includes the first light emitting cell 41 and the second light emitting cell 42. Here, light emitting cells are three-dimensional spaces included in one LED 111, and may be used as a meaning for specifying spaces including the n-type semiconductor layer 21, the p-type semiconductor layers 22-1, 22-2, and the light emitting layer as described above. Specifically, as illustrated in FIGS. 1A and 1B, the first light emitting cell 41 according to an embodiment of the disclosure may include a first n-type semiconductor layer 21, a first p-type semiconductor layer 22-1, and the first light emitting layer 31 respectively including at least one non-planar area. Also, the second light emitting cell 42 according to an embodiment of the disclosure may include a second n-type semiconductor layer 21, a second p-type semiconductor layer 22-2, and the second light emitting layer 32 respectively including a planar area.

Here, the feature that the first n-type semiconductor layer 21, the first p-type semiconductor layer 22-1, and the first light emitting layer 31 included in the first light emitting cell 41 respectively include at least one non-planar area means that at least some areas among the entire area of the first n-type semiconductor layer 21, at least some areas among the entire area of the first p-type semiconductor layer 22-1, and at least some areas among the entire area of the first light emitting layer 31 consist of non-planar areas.

Meanwhile, the feature that the second n-type semiconductor layer 21, the second p-type semiconductor layer 22-2, and the second light emitting layer 32 included in the second light emitting cell 42 respectively include a planar area means that at least some areas among the entire area of the second n-type semiconductor layer 21, at least some areas among the entire area of the second p-type semiconductor layer 22-2, and at least some areas among the entire area of the second light emitting layer 32 consist of planar areas.

In particular, the second n-type semiconductor layer 21, the second p-type semiconductor layer 22-2, and the second light emitting layer 32 included in the second light emitting cell 42 may respectively consist of a planar area. Here, the feature that the second n-type semiconductor layer 21, the second p-type semiconductor layer 22-2, and the second light emitting layer 32 included in the second light emitting cell 42 respectively consist of a planar area means a case where the entire area of the second n-type semiconductor layer 21, the entire area of the second p-type semiconductor layer 22-2, and the entire area of the second light emitting layer 32 consist of planar areas.

Hereinafter, for explaining the characteristics of the first light emitting cell 41 and the second light emitting cell 42 by clearly distinguishing the characteristics, explanation will be made mainly based on an example where the second n-type semiconductor layer 21, the second p-type semiconductor layer 22-2, and the second light emitting layer 32 included in the second light emitting cell 42 respectively consist of a planar area.

As described above, in the manufacturing process of the LED 111 according to the disclosure, based on the difference that while the second n-type semiconductor layer 21, the second p-type semiconductor layer 22-2, and the second light emitting layer 32 included in the second light emitting cell 42 are formed to respectively consist of a planar area, the first n-type semiconductor layer 21, the first p-type semiconductor layer 22-1, and the first light emitting layer 31 included in the first light emitting cell 41 are formed to respectively include at least one non-planar area, the first light emitting layer 31 included in the first light emitting cell 41 and the second light emitting layer 32 included in the second light emitting cell 42 may emit lights different from each other.

In other words, the first light emitting layer 31 and the second light emitting layer 32 according to an embodiment of the disclosure may emit lights having different wavelengths corresponding to colors different from each other. For example, the first light emitting layer 31 may emit a light of a wavelength of 450-490 nm corresponding to a blue color, and the second light emitting layer 32 may emit a light of a wavelength of 500-570 nm corresponding to a green color. In addition, the first light emitting layer 31 and the second light emitting layer 32 can emit a light of a wavelength of 600-750 nm corresponding to a red color.

Here, the feature that the first light emitting layer 31 and the second light emitting layer 32 emit lights having different wavelengths from each other is based on the feature that in the manufacturing process of the LED 111 according to the disclosure, the first light emitting layer 31 and the second light emitting layer 32 include materials having different compositions from each other. For example, the first light emitting layer 31 and the second light emitting layer 32 may include InGaN having different composition ratios of In from each other. If the first light emitting layer 31 and the second light emitting layer 32 include materials having different compositions from each other as such, the band gaps of InGaN included in each of the first light emitting layer 31 and the second light emitting layer 32 may become different in accordance thereto, and accordingly, the first light emitting layer 31 and the second light emitting layer 32 may emit lights having different wavelengths from each other.

Meanwhile, the feature that the first light emitting layer 31 and the second light emitting layer 32 include materials having different compositions from each other is based on the feature that in the manufacturing process of the LED 111 according to the disclosure, the first light emitting layer 31 is formed to include at least one non-planar area, and the second light emitting layer 32 is formed to consist of a planar area. Specifically, the incorporation rate of In during the growth of InGaN is greatly dependent on a crystal plane, and thus the compositions of In included in InGaN wells on a non-planar area and a planar area may be different even in the same condition for epitaxial growth. For example, in a condition for epitaxial growth where In having a composition such as $In_yGa_{1-y}N$ ($0.2<y<0.3$) is formed on a planar area, In having a much lower composition such as $In_xGa_{1-x}N$ ($0.1<x<0.2$) may be formed on a non-planar area.

Meanwhile, the specific compositions of In included in InGaN wells on a non-planar area and a planar area may be determined according to the size/pitch and growth condition of the mask pattern 50 in the manufacturing process of the LED 111, as will be described below with reference to FIGS. 2 to 3D. Accordingly, by controlling the size/pitch and growth condition of the mask pattern 50 in the manufacturing process of the LED 111, the first light emitting layer 31 including at least one non-planar area may be made to emit a light of a wavelength corresponding to a blue color, and the second light emitting layer 32 consisting of a planar area may be made to emit a light of a wavelength corresponding to a green color.

Meanwhile, the feature that the first light emitting layer 31 includes at least one non-planar area unlike the second light emitting layer 32 formed to consist of a planar area is based on the feature that in the manufacturing process of the LED 111 according to the disclosure, a mask is formed on an area where the first light emitting layer 31 is formed, and in accordance thereto, selective area growth is performed. Formation of a mask and selective area growth in accordance thereto will be described below with reference to FIGS. 3B to 3C.

Meanwhile, at least one non-planar area included in the first light emitting cell 41 according to the disclosure may be formed as a so-called facet structure. Specifically, the non-planar area may include at least one inclined plane, and may include, for example, at least one of crystal planes of which Miller indices are {11-22} and {10-11}.

However, at least one non-planer area included in each of the first n-type semiconductor layer 21, the first p-type semiconductor layer 22-1, and the light emitting layer of the first light emitting cell 41 is not limited to a specific form. That is, if a non-planar area includes a crystal plane different from the planar area included in the second light emitting cell 42, and the incorporation rate of In becomes different according to the different crystal plane, it may fall under at least one non-planar area according to the disclosure. An embodiment regarding an LED including another non-planar area will be described below with reference to FIG. 4.

Meanwhile, a semiconductor layer included in the first light emitting cell 41 and a semiconductor layer included in the second light emitting cell 42 have been respectively specified as the first n-type semiconductor layer 21, the first p-type semiconductor layer 22-1, the second n-type semiconductor layer 21, and the second p-type semiconductor layer 22-2, etc., but this is just for clearly specifying the semiconductor layer included in the first light emitting cell 41 and the semiconductor layer included in the second light emitting cell 42 by distinguishing them. Also, the first n-type semiconductor layer 21 and the second n-type semiconductor layer 21 may be formed by the same manufacturing process, and the first p-type semiconductor 22-1 and the second p-type semiconductor 22-2 may be also formed by the same manufacturing process. Accordingly, as in the explanation regarding the manufacturing method of an LED according to the disclosure, in particular, in case it is not necessary to specify the semiconductor layer included in the first light emitting cell 41 and the semiconductor layer included in the second light emitting cell 42 by clearly distinguishing them, they will be respectively referred to as an n-type semiconductor layer and a p-type semiconductor layer in general.

The mask pattern 50 is formed inside the n-type semiconductor layer 21, and this is in accordance to the feature that in the manufacturing process of the LED 111 according to the disclosure, the mask pattern 50 is formed on an n-type semiconductor after the n-type semiconductor layer 21 is formed, and then the n-type semiconductor layer 21, the light emitting layer, and the p-type semiconductor layers 22-1, 22-2 are sequentially re-grown. Also, at least one non-planar area included in the n-type semiconductor layer 21, the p-type semiconductor layer 22-1, and the first light emitting layer 31 included in the first light emitting cell 41 is formed on a window area of the mask pattern 50. The specific manufacturing method of the LED 111 including the formation process of the mask pattern 50 will be described in detail with reference to FIGS. 2 to 3D.

The common electrode 60 is electronically connected with the n-type semiconductor layer 21, and the first pixel electrode 71 and the second pixel electrode 72 are electronically connected with the p-type semiconductor layers 22-1, 22-2. Accordingly, the common electrode 60 may be referred to as an n-electrode, and the first pixel electrode 71 and the second pixel electrode 72 may be referred to as p-electrodes. Specifically, the common electrode 60 is electronically connected with the n-type semiconductor layer 21 by forming ohmic contact with the n-type semiconductor layer 21, and the first pixel electrode 71 and the second pixel electrode 72 are electronically connected with the p-type semiconductor layers 22-1, 22-2 by forming ohmic contact with the p-type semiconductor layers 22-1, 22-2. Also, the n-electrode and the p-electrodes may include oxides such as Al, Ti, Ni, Pd, Ag, Au, Au—Ge, indium-tin-oxide (ITO), and ZnO, and the like.

When a voltage is applied through the common electrode 60, the first pixel electrode 71, and the second pixel electrode 72, electrons inside the n-type semiconductor move to the side of the (+) terminal, and holes inside the p-type semiconductor move to the side of the (−) terminal, and currents get to flow by minority carriers formed in accordance thereto.

In particular, the first pixel electrode 71 and the second pixel electrode 72 according to the disclosure are independently connected with each of the first light emitting cell 41 and the second light emitting cell 42. Specifically, the first pixel electrode 71 and the second pixel electrode 72 are electronically connected with the p-type semiconductor layers 22-1, 22-2 included in each of the first light emitting cell 41 and the second light emitting cell 42. Then, as the first pixel electrode 71 and the second pixel electrode 72 are independently connected with the p-type semiconductor layers 22-1, 22-2 included in each of the first light emitting cell 41 and the second light emitting cell 42 as above, the intensity of the lights emitted from the first light emitting layer 31 and the second light emitting layer 32 included in each of the first light emitting cell 41 and the second light emitting cell 42 can be independently controlled.

Meanwhile, even if the first pixel electrode 71 and the second pixel electrode 72 are independently connected with each of the first light emitting cell 41 and the second light emitting cell 42, if the first light emitting cell 41 and the second light emitting cell 42, and the first pixel electrode 71 and the second pixel electrode 72 are not electronically distinguished from each other, the intensity of the lights emitted from the first light emitting layer 31 and the second light emitting layer 32 cannot be independently controlled. Accordingly, the LED 111 according to an embodiment of the disclosure may further include an etched area between the first light emitting cell 41 and the second light emitting cell 42 and a passivation layer 90-1, 90-2, 90-3.

Specifically, the first light emitting cell 41 and the second light emitting cell 42 may be divided horizontally by the etched area 80 between the first light emitting cell 41 and the second light emitting cell 42. That is, the etched area 80 plays the role of dividing the first light emitting cell 41 and the second light emitting cell 42 spatially. In particular, an area between the first light emitting cell 41 and the second light emitting cell 42 may be mesa-etched so that its upper end or lower end is flat, and its surroundings constitute steep incline. Here, etching may be performed by using various kinds of wet etching or dry etching technologies.

Meanwhile, the passivation layer 90-1, 90-2, 90-3 is formed on an area excluding the areas where the common electrode 60, the first pixel electrode 71, and the second pixel electrode 72 are formed, and accordingly, the characteristics of the LED 111 can be stabilized. In particular, the passivation layer 90-1, 90-2, 90-3 may play the role of an insulating layer making the first light emitting cell 41 and the second light emitting cell 42, and the first pixel electrode 71 and the second pixel electrode 72 electronically distinguished. Accordingly, the passivation layer 90-1, 90-2, 90-3 may consist of insulating materials such as $Al_2O_3$, SiN, and $SiO_2$, but the passivation layer 90-1, 90-2, 90-3 according to the disclosure is not limited to specific materials.

Meanwhile, on the passivation layer 90-1, 90-2, 90-3, a contact hole for making the common electrode 60, the first pixel electrode 71, and the second pixel electrode 72 form electrical contact with the n-type semiconductor layer 21 and the p-type semiconductor layers 22-1, 22-2 may be formed. In the case of the LED 111 illustrated in FIG. 1B, it is rather different from the LED 111 illustrated in FIG. 1A in the formation range of the passivation layer 90, but this is just in accordance with the feature that the passivation layer 90 is formed, and a contact hole is formed on the passivation layer 90, and then the common electrode 60, the first pixel electrode 71, and the second pixel electrode 72 are formed so that they can form electrical contact with the n-type semiconductor layer 21 and the p-type semiconductor layers 22-1, 22-2 through the contact hole.

Meanwhile, a case where the LED 111 according to the disclosure includes a first light emitting cell 41 and a second light emitting cell 42, and the second light emitting layer 32 emits a light different from the first light emitting layer 31 has been described in detail, but the disclosure is not limited thereto. That is, according to another embodiment of the disclosure, the LED 111 may further include a third light emitting cell in addition to the first light emitting cell 41 and the second light emitting cell 42, and a third light emitting layer included in the third light emitting cell may emit a light different from the first light emitting layer 31 and the second light emitting layer 32. An embodiment regarding the LED 111 further including a third light emitting cell will be described below with reference to FIG. 4.

Meanwhile, the LED 111 according to the disclosure may not only be applied to an LED 111 in a lateral type where the common electrode 60 and the pixel electrodes 71, 72 are arranged horizontally, but also to an LED 111 in a vertical type where the common electrode 60 and the pixel electrodes 71, 72 are arranged vertically, and an LED 111 in a flip-chip type using a method where when attaching a semiconductor chip to a circuit board 10, the semiconductor chip is welded as it is using an electrode pattern on the bottom side of the chip without using an additional connecting structure such as a meal lead (wire) or an intermediate medium such as a ball grid array (BGA).

According to an embodiment of the disclosure as described above, according to the difference between compositions of a non-planar area and a planar area included in one LED 111, lights in various colors may be emitted from the one LED 111. Also, by independently forming pixel electrodes on the non-planar area and the planar area and electronically distinguishing the two areas, the intensity of the lights emitted from the non-planar area and the planar area included in the one LED 111 can be independently controlled.

Hereinafter, a method of manufacturing the LED 111 as described above will be described in detail with reference to FIG. 2 and FIGS. 3A to 3D.

FIG. 2 is a flow chart for illustrating a manufacturing method of an LED according to an embodiment of the disclosure, and FIGS. 3A to 3D are diagrams for illustrating in detail steps of a manufacturing method of an LED according to an embodiment of the disclosure.

The structure of the LED 111 according to an embodiment of the disclosure and the characteristics and the functions of each layer included in the LED 111 have been described above in the explanation regarding FIGS. 1A and 1B, and thus overlapping explanation will be omitted unless it is for explaining the disclosure clearly.

A substrate 10 used for the manufacturing method of the LED 111 according to an embodiment of the disclosure may be a material appropriate for growth of a semiconductor or a carrier wafer, etc. Specifically, the substrate 10 may consist of materials such as sapphire ($Al_2SO_4$), Si, SiC, GaN, GaAs, and ZnO, and the like, but the substrate 10 used in the disclosure is not limited to specific materials.

Figure 3A:
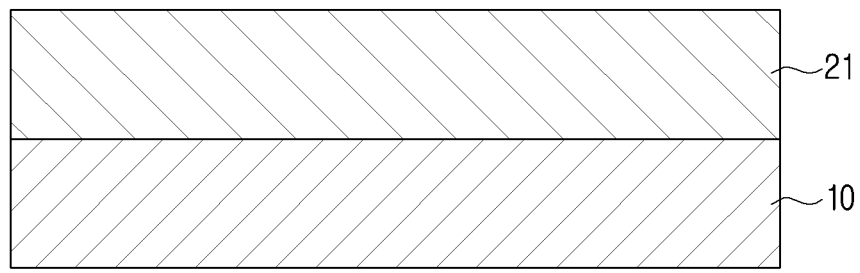
FIGS. 3A-3D are diagrams for illustrating in detail steps of a manufacturing method of an LED according to an embodiment of the disclosure.

When the substrate 10 is provided, the n-type semiconductor layer 21 is grown on the substrate 10 at operation S210, as illustrated in FIG. 3A. Specifically, growth of the n-type semiconductor layer 21 may be performed by deposition technologies such as metal organic chemical vapor deposition (MOCVD), metal organic vapor phase epitaxy (MOVPE), and molecular beam epitaxy (MBE).

Figure 3B:
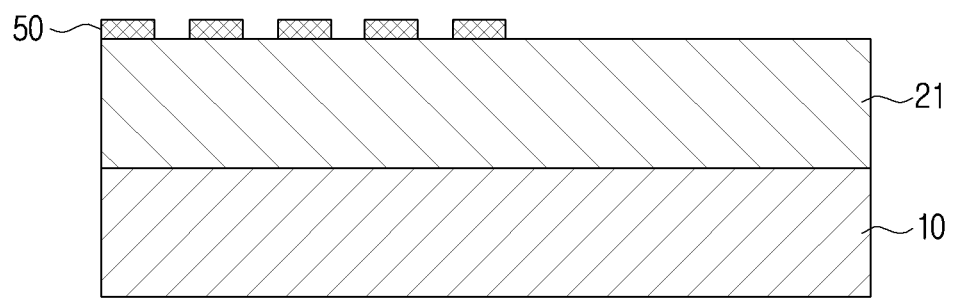

When the n-type semiconductor layer 21 is formed, the mask pattern 50 is formed on the first area of the n-type semiconductor layer 21 at operation S220, as illustrated in FIG. 3B. Here, formation of the mask pattern 50 may be performed by general lithography technologies such as photolithography and nano-imprinting lithography. Also, the mask pattern 50 may be formed as a line-and-space pattern. The interval of the mask may be 1 μm to 10 μm, and the size of the window area that will be described below is determined in accordance thereto. Meanwhile, the materials of the mask may include $SiO_2$ or SiN.

Figure 3C:
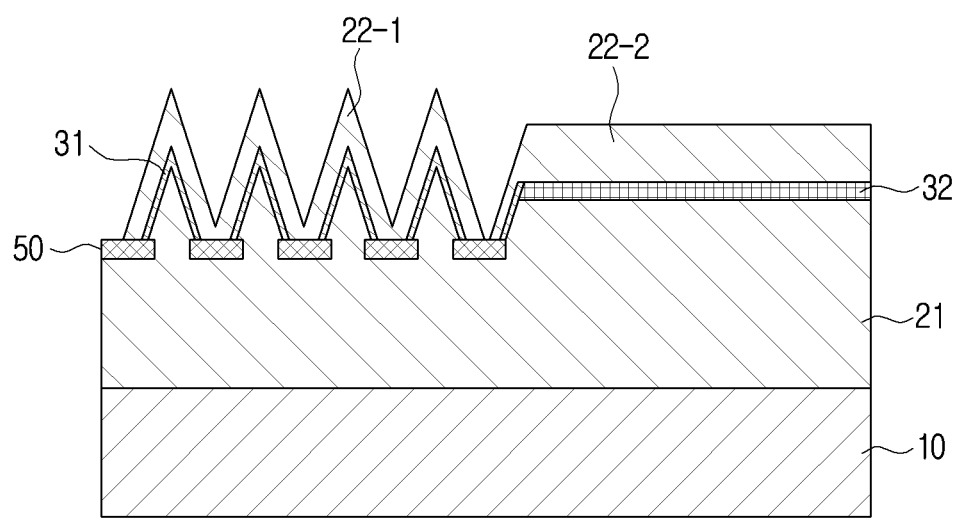

When the mask pattern 50 is formed, the n-type semiconductor layer 21, the light emitting layer, and the p-type semiconductor layers 22-1, 22-2 are sequentially re-grown on the n-type semiconductor layer 21 at operation S230, as illustrated in FIG. 3C. Here, the deposition technologies for growing the n-type semiconductor layer 21, the light emitting layer, and the p-type semiconductor layers 22-1, 22-2 are as described above.

When the n-type semiconductor layer 21, the light emitting layer, and the p-type semiconductor layers 22-1, 22-2 are sequentially re-grown on the n-type semiconductor layer 21, at least one non-planar area may be formed on the first area where the mask pattern 50 is formed, unlike the second area where the mask pattern 50 is not formed. Specifically, on the first area where the mask pattern 50 is formed, selective area growth through the window area of the mask pattern 50 may be performed, and in accordance thereto, at least one non-planar area may be formed.

Here, the at least one non-planar area may be formed as a so-called facet structure. For example, the non-planar area may include at least one inclined plane, and may include, in particular, at least one of crystal planes of which Miller indices are {11-22} and {10-11}. Also, the height of the non-planar area may be 0.5 μm to 5 μm.

When the first light emitting layer 31 includes at least one non-planar area according to selective area growth, the first light emitting layer 31 and the second light emitting layer 32 get to include materials having different compositions in accordance thereto. Specifically, the incorporation rate of In during the growth of InGaN is greatly dependent on a crystal plane, and thus the compositions of In included in InGaN wells on a non-planar area and a planar area may be different even in the same condition for epitaxial growth. For example, in a condition for epitaxial growth where In having a composition such as $In_yGa_{1-y}N$ (0.2<y<0.3) is formed on a planar area, In having a much lower composition such as $In_xGa_{1-x}N$ (0.1<x<0.2) may be formed on a non-planar area.

Also, if the first light emitting layer 31 and the second light emitting layer 32 include materials having different compositions from each other, the first light emitting layer 31 and the second light emitting layer 32 may emit lights of different wavelengths from each other. Specifically, the wavelength of a light emitted from a light emitting layer is determined by the band gap of an active area, and the band gap of the active area is dependent on the composition of the light emitting layer. For example, as the composition of In is lower, the wavelength of a light emitted from InGaN becomes shorter, and thus the composition of In of an InGaN well emitting a blue light is lower than the composition of In of an InGaN well emitting a green light.

Meanwhile, the specific compositions of In included in InGaN wells on a non-planar area and a planar area may be determined according to the size/pitch and growth condition of the mask pattern 50 in the manufacturing process of the LED 111. Accordingly, by controlling the size/pitch and growth condition of the mask pattern 50 in the manufacturing process of the LED 111, the first light emitting layer 31 including at least one non-planar area may be made to emit a light of a wavelength corresponding to a blue color, and the second light emitting layer 32 consisting of a planar area may be made to emit a light of a wavelength corresponding to a green color.

Meanwhile, by sequentially re-growing the n-type semiconductor layer 21, the light emitting layer, and the p-type semiconductor layers 22-1, 22-2 on the n-type semiconductor layer 21, the first light emitting cell 41 and the second light emitting cell 42 according to the disclosure may be formed. Specifically, the first light emitting cell 41 including the first n-type semiconductor layer 21, the first p-type semiconductor layer 22-1, and the first light emitting layer 31 which respectively include at least one non-planar area may be formed on a first area, and the second light emitting cell 42 including the second n-type semiconductor layer 21, the second p-type semiconductor layer 22-2, and the second light emitting layer 32 emitting a light of a different wavelength from the first light emitting layer 31 which a planar area may be formed on a second area different from the first area.

Figure 3D:
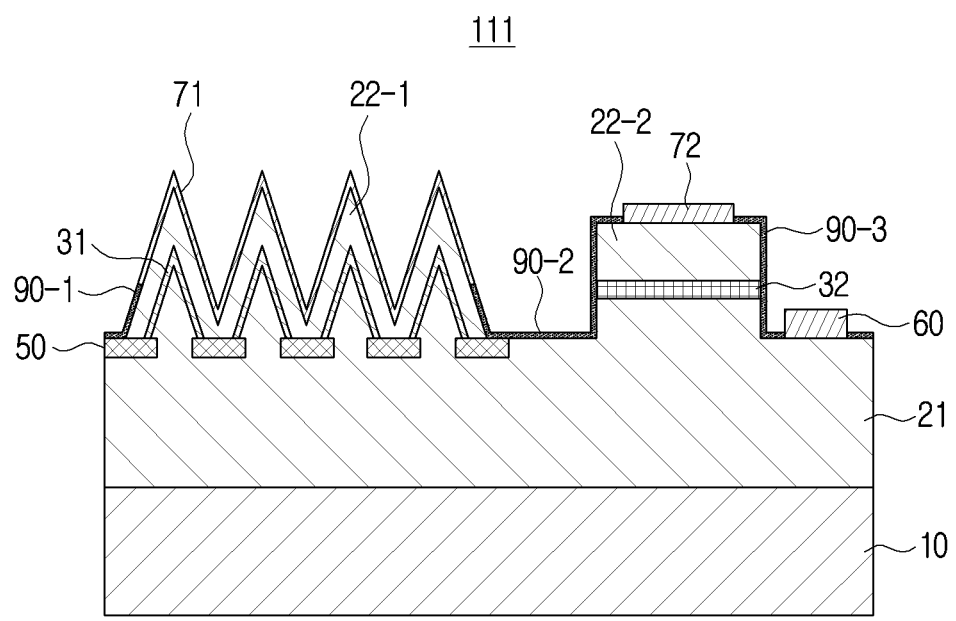

When sequential re-growth of the n-type semiconductor layer 21, the light emitting layer, and the p-type semiconductor layers 22-1, 22-2 is performed, the common electrode 60, the first pixel electrode 71, and the second pixel electrode 72 are formed at operation S240, as illustrated in FIG. 3D. Here, the common electrode 60 is electronically connected with the n-type semiconductor layer 21, and the first pixel electrode 71 and the second pixel electrode 72 are electronically connected with the p-type semiconductor layers 22-1, 22-2.

Specifically, the common electrode 60 is electronically connected with the n-type semiconductor layer 21 by forming ohmic contact with the n-type semiconductor layer 21, and the first pixel electrode 71 and the second pixel electrode 72 are electronically connected with the p-type semiconductor layers 22-1, 22-2 by forming ohmic contact with the p-type semiconductor layers 22-1, 22-2. Also, the n-electrode and the p-electrodes may be formed by various process technologies such as sputtering, evaporation, and spin coating for electrode materials such as Al, Ti, Ni, Pd, Ag, Au, Au—Ge, indium-tin-oxide (ITO), and ZnO, and the like.

In particular, the first pixel electrode 71 and the second pixel electrode 72 according to the disclosure are independently connected with each of the first light emitting cell 41 and the second light emitting cell 42. Specifically, the first pixel electrode 71 and the second pixel electrode 72 are electronically connected with the p-type semiconductor layers 22-1, 22-2 included in each of the first light emitting cell 41 and the second light emitting cell 42.

Meanwhile, the LED 111 according to an embodiment of the disclosure further includes the etched area 80 between the first light emitting cell 41 and the second light emitting cell 42, and the passivation layer 90-1, 90-2, 90-3. Hereinafter, formation of the etched area 80 and the passivation layer 90-1, 90-2, 90-3 will be explained.

When the common electrode 60, the first pixel electrode 71, and the second pixel electrode 72 are formed, an area between the first light emitting cell 41 and the second light emitting cell 42 is etched at operation S250. Specifically, before etching, an area to be etched by a photoresist process may be patterned, and etching may be performed by using a wet etching or dry etching technology, etc. For example, etching may be performed by using dry etching technologies such as reactive ion etching (RIE), electro-cyclotron resonance (ECR), inductively coupled plasma reactive ion etching (ICP-RIE), and chemically assisted ion-beam etching (CAIBE), and the like. In particular, an area between the first light emitting cell 41 and the second light emitting cell 42 may be mesa-etched so that its upper end or lower end is flat, and its surroundings constitute steep incline.

When etching is performed, the first light emitting cell 41 and the second light emitting cell 42 may be divided horizontally by the etched area 80 between the first light emitting cell 41 and the second light emitting cell 42. That is, the etched area 80 plays the role of dividing the first light emitting cell 41 and the second light emitting cell 42 spatially.

When an area between the first light emitting cell 41 and the second light emitting cell 42 is etched, the passivation layer 90-1, 90-2, 90-3 is formed at operation S260. Specifically, the passivation layer 90-1, 90-2, 90-3 may be formed by atomic layer deposition, e-beam evaporation, sputtering, spin coating, etc. In particular, the passivation layer 90-1, 90-2, 90-3 according to the disclosure is formed on an area excluding the areas where the common electrode 60, the first pixel electrode 71, and the second pixel electrode 72 are formed, and accordingly, the characteristics of the LED 111 can be stabilized. Also, the passivation layer 90-1, 90-2, 90-3 may play the role of an insulating layer making the first light emitting cell 41 and the second light emitting cell 42, and the first pixel electrode 71 and the second pixel electrode 72 electronically distinguished. Accordingly, the passivation layer 90-1, 90-2, 90-3 may consist of insulating materials such as $Al_2O_3$, SiN, and $SiO_2$, but the passivation layer 90-1, 90-2, 90-3 according to the disclosure is not limited to specific materials.

Meanwhile, in the case of a step of depositing or forming a plurality of equivalent components such as the step of forming the common electrode 60, the first pixel electrode 71, and the second pixel electrode 72 as described above, no time-series element exists between two steps. In addition, the order of the manufacturing method as described above can vary within a range for achieving the purpose of the disclosure.

According to the LED 111 as described above, based on the difference between compositions of a non-planar area and a planar area included in one LED 111, lights in various colors may be emitted from the one LED 111. Also, by independently forming pixel electrodes on the non-planar area and the planar area and electronically distinguishing the two areas, the intensity of the lights emitted from the non-planar area and the planar area included in the one LED 111 can be independently controlled.

In addition, in the manufacturing method of the LED 111 as described above, the mask pattern 50 for the growth of a non-planar area may be formed by a general process, etc., and the manufacturing process also does not require a process with high cost and a low processing amount. That is, the LED 111 according to the disclosure can be manufactured effectively by a low-cost process.

Figure 4:
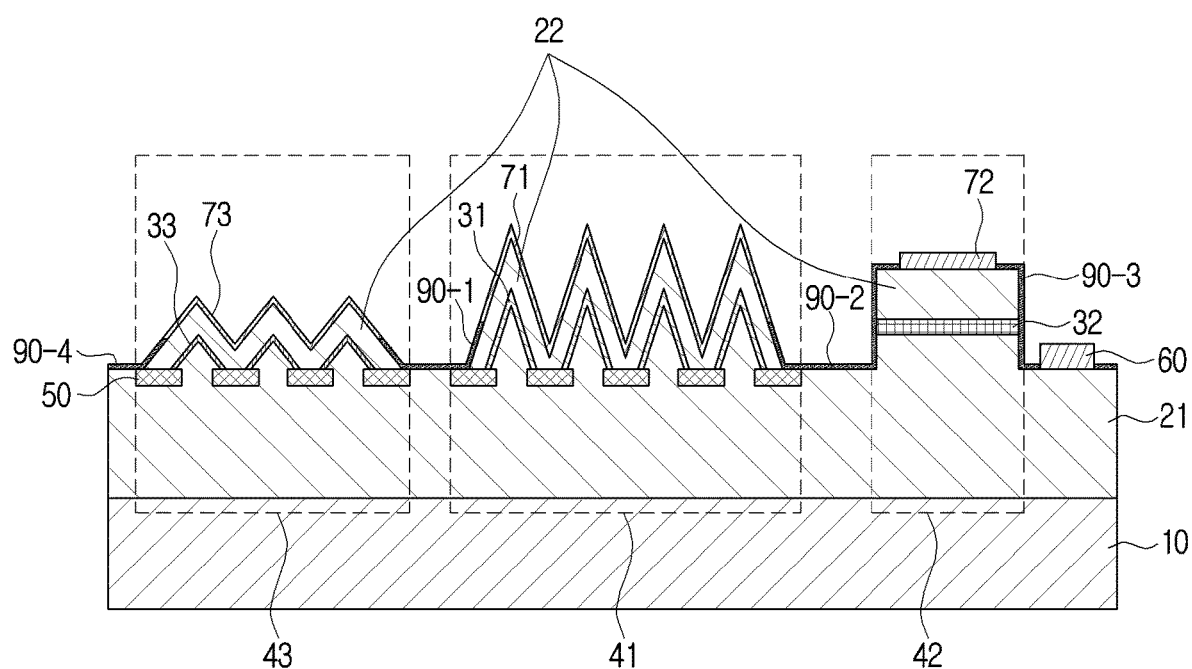
FIG. 4 is a diagram illustrating a configuration of an LED that is capable of emitting lights of three different colors according to an embodiment of the disclosure.

FIG. 4 is a diagram illustrating a configuration of an LED that is capable of emitting lights of three different colors according to an embodiment of the disclosure.

A case where the LED 111 according to the disclosure includes a first light emitting cell 41 and a second light emitting cell 42, and the second light emitting layer 32 emits a light different from the first light emitting layer 31 has been described in detail. However, the disclosure is not just limited to an LED capable of emitting two lights having different wavelengths, and the embodiments according to the disclosure can be extended to an LED capable of emitting a plurality of lights having different wavelengths from one another.

That is, as illustrated in FIG. 4, according to another embodiment of the disclosure, the LED 111 may further include a third light emitting cell 43 together with the first light emitting cell 41 and the second light emitting cell 42. Specifically, the third light emitting cell 43 may include an n-type semiconductor layer 21, a p-type semiconductor layer 22, and a third light emitting layer 33 which respectively include at least one non-planar area.

Here, the non-planar area included in the third light emitting cell 43 may be different from the non-planar area included in the first light emitting cell 41, and the third light emitting layer 33 included in the third light emitting cell 43 may emit a light of a different wavelength from the first light emitting layer 31 included in the first light emitting cell 41 and the second light emitting layer 32 included in the second light emitting cell 42.

As described above, the feature that the third light emitting layer 33 emits a light of a different wavelength from the first light emitting layer 31 and the second light emitting layer 32 is based on the feature that in the manufacturing process of the LED 111 according to the disclosure, the third light emitting layer 33 includes a material having a composition different from the first light emitting layer 31 and the second light emitting layer 32.

Also, the feature that the third light emitting layer 33 includes a material having a composition different from the first light emitting layer 31 and the second light emitting layer 32 is based on the feature that the non-planar area included in the third light emitting cell 43 is different from the non-planar area included in the first light emitting cell 41, and accordingly, the third light emitting layer 33 includes a crystal plane different from the first light emitting layer 31 and the second light emitting layer 32. That is, as described above, the incorporation rate of In during the growth of InGaN is greatly dependent on a crystal plane, and thus the compositions of In included in InGaN wells between non-planar areas including crystal planes different from each other may be different even in the same condition for epitaxial growth.

Meanwhile, as illustrated in FIG. 4, the LED 111 according to an embodiment of the disclosure may further include a third pixel electrode 73 independently connected with the third light emitting cell 43, and the common electrode 60 may be commonly connected with the first light emitting cell 41, the second light emitting cell 42, and the third light emitting cell 43.

Also, as illustrated in FIG. 4, the LED 111 may further include an etched area between the first light emitting cell 41 and the third light emitting cell 43, and a passivation layer 90-1, 90-2, 90-3, 90-4. Specifically, the first light emitting cell 41 and the third light emitting cell 43 may be divided horizontally by an etched area between the first light emitting cell 41 and the third light emitting cell 43. Also, the passivation layer 90-1, 90-2, 90-3, 90-4 is formed on an area excluding the areas where the common electrode 60, the first pixel electrode 71, the second pixel electrode 72, and the third pixel electrode 73 are formed, and accordingly, the characteristics of the LED 111 can be stabilized. In particular, the passivation layer 90-1, 90-2, 90-3, 90-4 may play the role of an insulating layer making the first light emitting cell 41, the second light emitting cell 42, and the third light emitting cell 43, and the first pixel electrode 71, the second pixel electrode 72, and the third electrode respectively distinguished electronically.

According to an embodiment of the disclosure as described above, the first light emitting layer 31 included in the LED 111 may emit a light of a wavelength of 450-490 nm corresponding to a blue color, and the second light emitting layer 32 may emit a light of a wavelength of 500-570 nm corresponding to a green color, and the third light emitting layer 33 may emit a light of a wavelength of 600-750 nm corresponding to a red color.

Accordingly, the LED 111 according to an embodiment of the disclosure may emit lights of three colors from one LED 111 according to the difference in compositions of two non-planar areas and one planar area included in the one LED 111. Also, as pixel electrodes are independently formed on each light emitting cell that can emit lights of blue, green, and red colors, and each area is electronically distinguished, the LED 111 according to an embodiment of the disclosure can independently control the intensity of the lights emitted from the non-planar areas and the planar area included in the one LED 111.

Meanwhile, an embodiment where the LED 111 includes a first light emitting cell 41 including at least one non-planar area, a second light emitting cell 42 consisting of a planar area, and a third light emitting cell 43 including at least one non-planar area different from the non-planar area of the first light emitting cell 41 has been described in detail. However, the second light emitting cell 42 can be implemented to include a non-planar area different from the non-planar areas included in the first light emitting cell 41 and the third light emitting cell 43.

The LED 111 and the manufacturing method of the LED 111 according to the various embodiments of the disclosure have been described in detail. Hereinafter, a display device including the LED 111 as described above will be explained.

Figure 5:
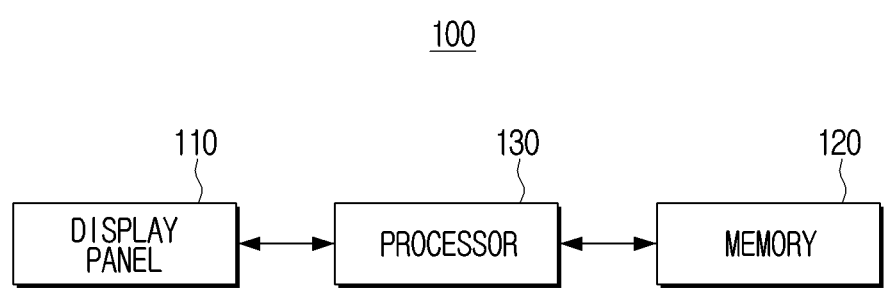
FIG. 5 is a block diagram illustrating a schematic configuration of a display device including an LED according to an embodiment of the disclosure.

FIG. 5 is a block diagram illustrating a schematic configuration of a display device including an LED according to an embodiment of the disclosure.

Figure 6:
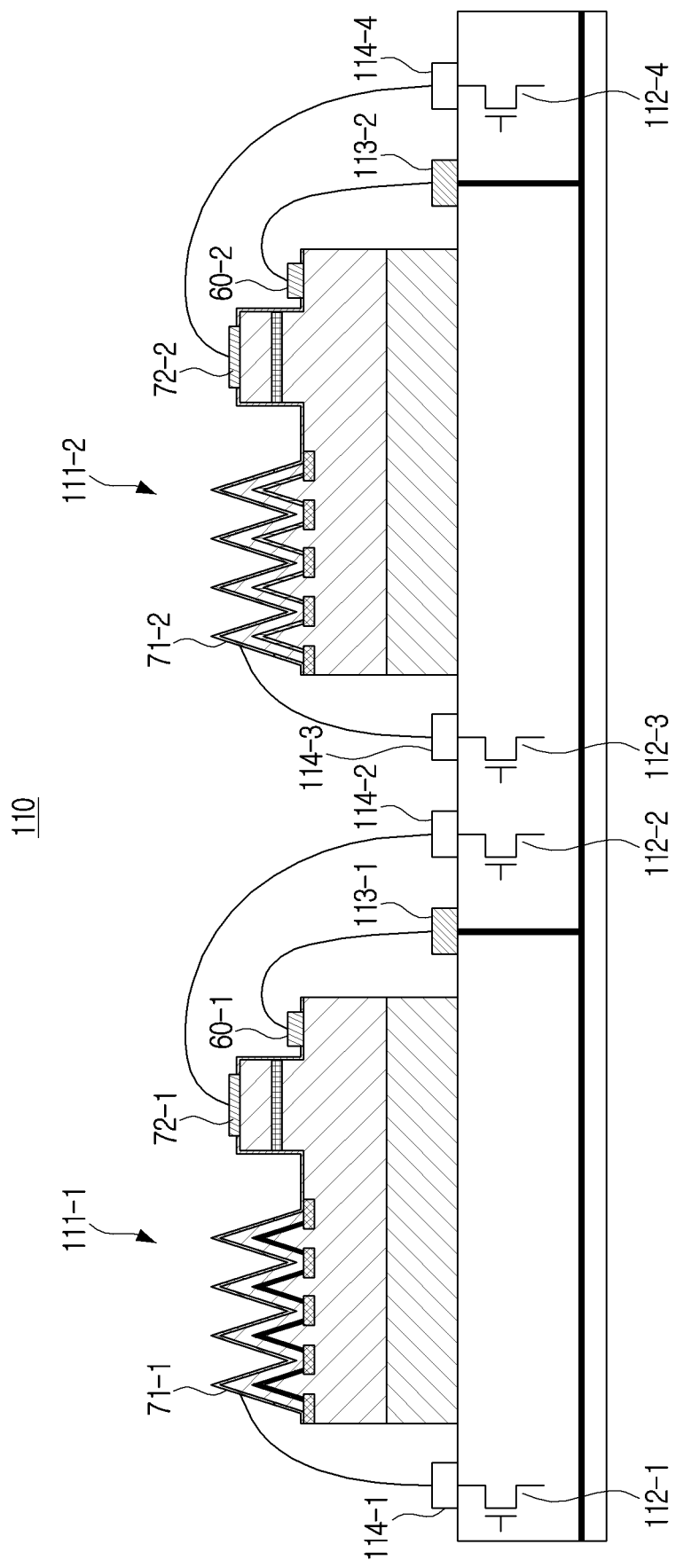
FIG. 6 is a sectional view for illustrating a configuration of a display panel included in a display device according to an embodiment of the disclosure.
Figure 7:
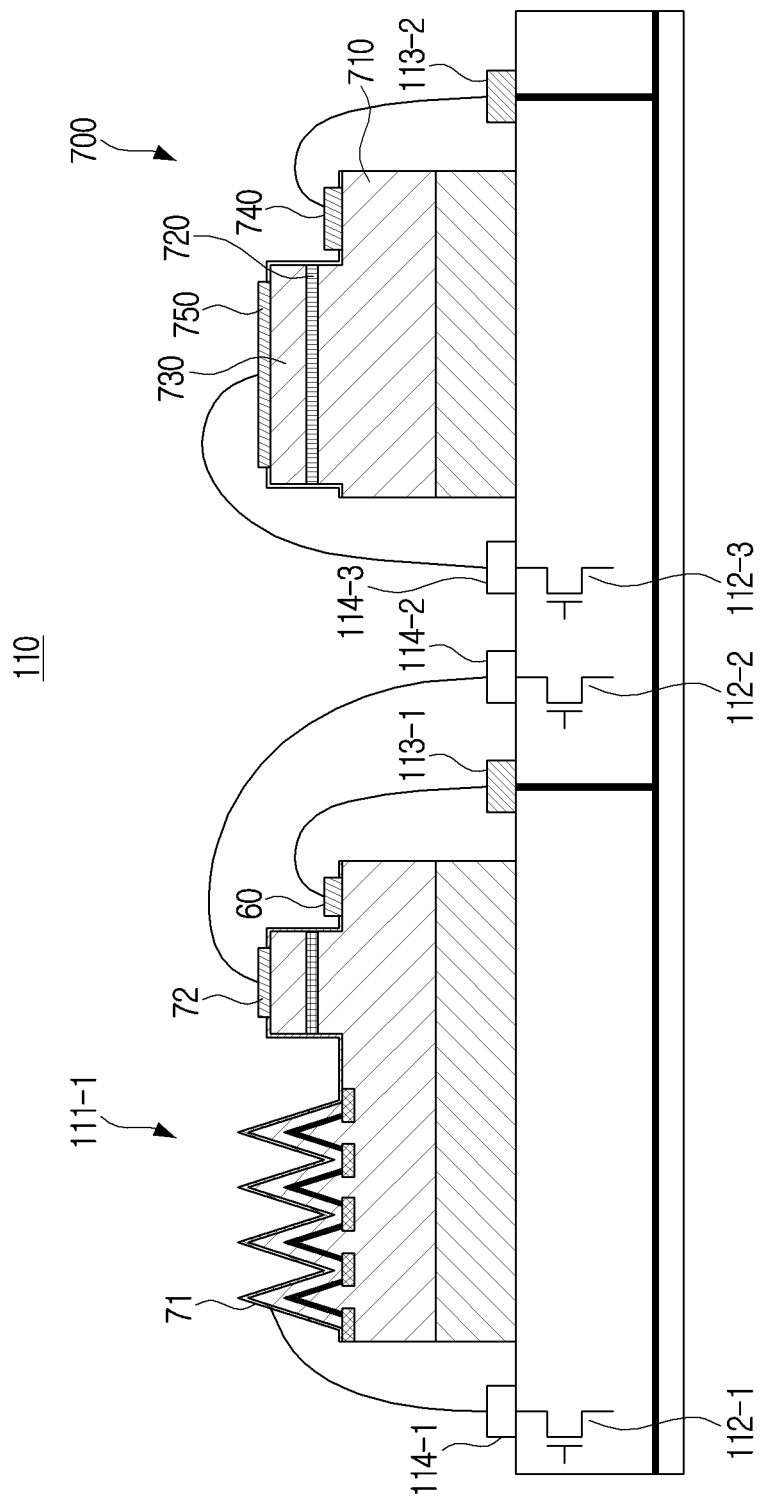
FIG. 7 is a sectional view for illustrating a configuration of a display panel included in a display device according to an embodiment of the disclosure.

Referring to FIG. 5, a display device 100 according to an embodiment of the disclosure includes a display panel 110, a memory 120, and a processor 130. Also, the display panel 110 includes a plurality of LEDs 111-1, 111-2 and a plurality of switching elements 112-1, 112-2, 112-3, 112-4. Here, the plurality of switching elements 112-1, 112-2, 112-3, 112-4 are illustrated in FIGS. 6 and 7. Meanwhile, at least one LED among the plurality of LEDs 111-1, 111-2 may be an LED 111 as described above with reference to FIGS. 1 to 4.

Specifically, at least one LED 111 included in the display device 100 according to an embodiment of the disclosure respectively includes a first light emitting cell including an n-type semiconductor layer, a p-type semiconductor layer, and a first light emitting layer which respectively include at least one non-planar area, a second light emitting cell including an n-type semiconductor layer, a p-type semiconductor layer, and a second light emitting layer emitting a light of a different wavelength from the first light emitting layer which respectively consist of a planar area, a common electrode commonly connected with the first light emitting cell and the second light emitting cell, and a first pixel electrode and a second pixel electrode independently connected with each of the first light emitting cell and the second light emitting cell. In addition, the LED 111 included in the display device 100 according to the disclosure may include the characteristics of the LED 111 according to the various embodiments of the disclosure as described above with reference to FIGS. 1 to 4.

The switching element is a semiconductor element constituted such that it can control the operation of the LED 111 included in the display panel 110, and plays the role of a kind of switch for individual pixels of the display device 100. As such, as a switching element, a driving thin film transistor (TFT) as illustrated in FIGS. 6 and 7 can be used.

In particular, the display panel 110 according to an embodiment of the disclosure may further include a first switching element (e.g., 112-1) electronically connected with the first pixel electrode (e.g., 71-1) and a second switching element (e.g., 112-2) electronically connected with the second pixel electrode (e.g., 72-1). Also, the first switching element (e.g., 112-1) and the second switching element (e.g., 112-2) may be independently connected with each of the first light emitting cell and the second light emitting cell respectively through the first pixel electrode and the second pixel electrode.

The memory 120 may store at least one instruction regarding the display device 100. Also, an operating system (O/S) for operating the display device 100 may be stored in the memory 120. In addition, various kinds of software programs or applications for making the display device 100 operate according to the various embodiments of the disclosure may be stored in the memory 120. Further, the memory 120 may include a semiconductor memory such as a flash memory and a magnetic storage medium like a hard disk, and the like.

Specifically, the memory 120 may store various kinds of software modules for making the display device 100 operate according to the various embodiments of the disclosure, and the processor 130 may control the operation of the display device 100 by executing the various kinds of software modules stored in the memory 120. That is, the memory 120 may be accessed by the processor 130, and reading/recording/correction/deletion/update, etc. of data by the processor 130 may be performed.

Meanwhile, in the disclosure, the term memory 120 may be used as a meaning including the memory 120, a ROM (not shown) and a RAM (not shown) inside the processor 130, or a memory card (not shown) installed on an electronic device (e.g., a micro SD card, a memory stick).

The processor 130 controls the overall operations of the display device 100. Specifically, the processor 130 may be connected with the components of the display device 100 including the display panel 110 and the memory 120 as described above, and control the overall operations of the display device 100 by executing at least one instruction stored in the memory 120 as described above.

The processor 130 may be implemented in various ways. For example, the processor 130 may be implemented as at least one among an application specific integrated circuit (ASIC), an embedded processor, a microprocessor, hardware control logic, a hardware finite state machine (FSM), or a digital signal processor (DSP). Meanwhile, in the disclosure, the term processor 130 may be used as a meaning including a central processing unit (CPU), a graphic processing unit (GPU), a main processing unit (MPU), etc.

In particular, in the various embodiments according to the disclosure, the processor 130 may independently control the operations of the first light emitting cell and the second light emitting cell of the LED 111. Specifically, as described above, the LED 111 according to the disclosure includes a first light emitting cell, a second light emitting cell, a first pixel electrode independently connected with the first light emitting cell, and a second pixel electrode independently connected with the second light emitting cell. Also, the display panel 110 may include a first switching element 112 electronically connected with the first pixel electrode and a second switching element 112 electronically connected with the second pixel electrode. Accordingly, the processor 130 may independently control the operations of the first light emitting cell and the second light emitting cell through the first switching element 112 and the second switching element 112.

Detailed embodiments regarding the arrangement of the pixels of the display panel 110 and control of the processor 130 will be described below in the explanation regarding FIGS. 6 and 7.

FIGS. 6 and 7 are sectional views for illustrating a configuration of a display panel included in a display device according to an embodiment of the disclosure.

In FIGS. 6 and 7, reference numerals regarding specific components of an LED were mostly omitted, but this is just for expressing the relation between the electrodes of the plurality of LEDs and the display panel 110 more clearly, and specific components of an LED are as described above through FIGS. 1A to 4 and explanation in that regard.

As illustrated in FIGS. 6 and 7, the display panel 110 according to an embodiment of the disclosure may include a plurality of LEDs 111-1, 111-2, 700, electrode pads 113, 114, and a plurality of switching elements 112-1, 112-2, 112-3, 112-4.

Specifically, according to an embodiment of the disclosure, as illustrated in FIG. 6, the plurality of LEDs 111-1, 111-2 may include a first light emitting cell and a second light emitting cell, and also include common electrodes 60-1, 60-2 commonly connected with the first light emitting cell and the second light emitting cell, and first pixel electrodes 71-1, 71-2 and second pixel electrodes 72-1, 72-2 individually connected with each of the first light emitting cell and the second light emitting cell.

Also, as illustrated in FIG. 6, the common electrodes 60-1, 60-2 may be connected with the plurality of LEDs 111-1, 111-2 through the n-pads 113-1, 113-2 among the electrode pads on the circuit board, and the first pixel electrodes 71-1, 71-2 and the second pixel electrodes 72-1, 72-2 may respectively be connected with the first switching elements 112-1, 112-3 and the second switching elements 112-2, 112-4 individually through the p-pads 114-1, 114-2, 114-3, 114-4 on the circuit board.

Meanwhile, according to another embodiment of the disclosure, as illustrated in FIG. 7, the first LED 111-1 among the plurality of LEDs 111-1, 700 included in the display panel 110 may include a first light emitting cell and a second light emitting cell, and the second LED 700 among the plurality of LEDs 111-1, 700 included in the display panel 110 may be a general LED not including a plurality of light emitting cells. Here, a general LED is for referring to an LED emitting a light of one color unlike the LED 111 according to the disclosure. Specifically, the second LED 700 which is a general LED may respectively include one n-type semiconductor layer 710, a light emitting layer 720, and a p-type semiconductor layer 730, a common electrode 740 connected with the n-type semiconductor layer and a pixel electrode 750 connected with the p-type semiconductor layer.

Also, as illustrated in FIG. 7, the common electrode 60 of the first LED 111-1 may be connected with the plurality of LEDs 700 through the n-pad 113-1 among the electrode pads on the circuit board, and each of the first pixel electrode and the second pixel electrode of the first LED 111-1 may be individually connected with the first switching element 112-1 and the second switching element 112-2 through the p-pads 114-1, 114-2 on the circuit board. Meanwhile, the common electrode 740 of the second LED 700 may be connected with the plurality of LEDs 111-1 through the n-pad 113-2 among the electrode pads on the circuit board, and the pixel electrode 750 of the second LED 700 may be connected with the switching element 112-3 through the p-pad 114-3 on the circuit board.

When the display panel 110 is implemented as in FIGS. 6 and 7, the processor 130 may independently control light emission of the plurality of LEDs 111-1, 111-2, 700. To be more specific, the processor 130 may individually control each of the plurality of light emitting cells included in the plurality of LEDs 111.

Meanwhile, each of the light emitting cells included in the plurality of LEDs 111-1, 111-2, 700 as illustrated in FIGS. 6 and 7 may correspond to one of the plurality of sub pixels constituting the pixels of one display panel 110. Specifically, the display panel 110 may include a plurality of pixels arranged in the form of a matrix, and each of the plurality of pixels may include an R sub pixel, a G sub pixel, and a B sub pixel.

Also, each of the R sub pixel, the G sub pixel, and the B sub pixel may correspond to the LED 111 itself or a light emitting cell included in the LED 111. For example, in the LED as illustrated in FIG. 6, the B sub pixel among the plurality of sub pixels constituting the pixels of the display panel 110 may correspond to the first light emitting cell of the first LED 111-1, and the G sub pixel may correspond to the second light emitting cell of the first LED 111-1, and the R sub pixel may correspond to the first light emitting cell of the second LED 111-2. In addition, in the LED as illustrated in FIG. 7, the R sub pixel may correspond to the first light emitting cell of the first LED 111-1, and the G sub pixel may correspond to the second light emitting cell of the first LED 111-1, and the B sub pixel may correspond to the second LED 700 not including a plurality of light emitting cells.

Meanwhile, light emission efficiency of an LED, in particular, external quantum efficiency (EQE) shows big differences for each color. For example, in the case of a GaN-based LED, the red color shows EQE of less than 10%, the green color shows EQE of less than 30%, and the blue color shows EQE of less than 80%. That is, in the cases of a red element and a green element, they show much less light emission efficiency than a blue element. Accordingly, in implementing a color having low light emission efficiency as above, for satisfying required luminance, high power should be used or the light emission area should be broadened.

Meanwhile, the display panel 110 according to an embodiment of the disclosure includes an LED 111 that is capable of emitting a plurality of lights having different wavelengths from one another in two or more light emission areas divided horizontally. Accordingly, if the light emission area of a light emitting cell for implementing a color having low light emission efficiency is formed to be broad among light emitting cells included in the LED 111 according to the disclosure, the problem as described above can be overcome effectively.

Specifically, according to an embodiment of the disclosure, the display panel 110 may be implemented to include the LED 111 where the light emission area of the first light emitting cell and the light emission area of the second light emitting cell are different from each other. Specifically, the display panel 110 may be implemented such that the light emission area of a light emitting cell for implementing a red color and the light emission area of a light emitting cell for implementing a green color have broader light emission areas than the light emission area of a light emitting cell for implementing a blue color.

As above, by forming the light emission area of the first light emitting cell and the light emission area of the second light emitting cell included in the same LED 111 to be asymmetrical, the light emission area of a light emitting cell for implementing a color desired to be emphasized can be extended, and accordingly, color reproducibility of the display device 100 can be improved. Also, as described above, by forming the light emission area of a light emitting cell for implementing a color having low light emission efficiency to be broad, the problem of power consumption due to the difference in light emission efficiency for each pixel color in manufacturing the display device 100 can be overcome.

Meanwhile, in the case of implementing the display panel 110 as in FIG. 6 or FIG. 7, the light emission area of the second light emitting cell included in the LED 111 may be defined as a necessary light emission area, and the light emission area of the first light emitting cell may be defined as a spare light emission area. Also, in accordance thereto, the display panel 110 may be implemented such that operation of pixels as a general display device 100 is performed by the second light emitting cell, and in case a specification of high luminance, high purity, or high resolution is necessary according to the production specification of the display, the first light emitting cell is used.

Meanwhile, defective pixels generated in the LED 111 may be repaired by using a spare light emission area defined as described above, and explanation in this regard will be made with reference to FIG. 8.

Figure 8:
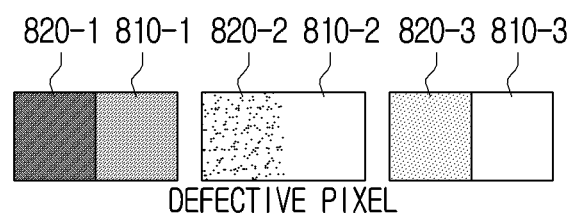
FIG. 8 is a diagram for illustrating an embodiment related to a case where a defective pixel occurred in an LED according to an embodiment of the disclosure.

FIG. 8 is a diagram for illustrating an embodiment related to a case where a defective pixel occurs in an LED according to an embodiment of the disclosure.

The LED 111 according to an embodiment of the disclosure may include a plurality of light emitting cells, and may emit lights of two different colors through light emitting layers included in the plurality of light emitting cells. FIG. 8 illustrates the light emission areas 820-1, 820-2, 820-3 of the first light emitting cell and the light emission areas 810-1, 810-2, 810-3 of the second light emitting cell included in each of the plurality of LEDs 111. Also, as described above, the light emission areas 810-1, 810-2, 810-3 of the second light emitting cell may be defined as necessary light emission areas, and the light emission areas 820-1, 820-2, 820-3 of the first light emitting cell may be defined as spare light emission areas.

In case the LED 111 according to an embodiment of the disclosure operates normally, all light emitting cells included in the necessary light emission areas of each LED 111 may operate normally, or all light emitting cells included in the necessary light emission areas and the spare light emission areas may operate normally.

However, as illustrated in FIG. 8, defective pixels may occur in at least one of the light emission areas 820-1, 820-2, 820-3 of the first light emitting cell and the light emission areas 810-1, 810-2, 810-3 of the second light emitting cell. In this case, the display device 100 according to the disclosure may repair the generated defective pixels by independently controlling operation of the first light emitting cell and the second light emitting cell included in the LED 111.

That is, the display device 100 may control the display panel 110 to replace the defective pixels by using at least one of the first light emitting cell or the second light emitting cell included in an LED 111 adjacent to the area where the defective pixels were generated. For example, as illustrated in FIG. 8, the processor 130 may control the display panel 110 to replace the defective pixels by using a light emission area 810-1 included in the LED 111 adjacent to the area 820-2 where the defective pixels were generated.

According to an embodiment of the disclosure as described above, by effectively repairing the generated defective pixels, the problem of the cost of a repairing process according to defective pixels can be overcome.

Also, according to the LED 111 as described above with reference to FIGS. 1A to 8, based on the difference between compositions of a non-planar area and a planar area included in one LED 111, lights in various colors may be emitted from the one LED 111. Also, by independently forming pixel electrodes on the non-planar area and the planar area and electronically distinguishing the two areas, the intensity of the lights emitted from the non-planar area and the planar area included in the one LED 111 can be independently controlled.

In addition, in the manufacturing method of the LED 111 as described above, the mask pattern for the growth of a non-planar area may be formed by a general photolithography process, etc., and the manufacturing process also does not require a process with high cost and a low processing amount. That is, the LED 111 according to the disclosure can be manufactured effectively by a low-cost process.

Further, according to the LED 111 as described above, in the manufacturing process of a display device, light emission areas can be effectively defined, and pixels for two or more colors can be implemented in one LED 111, and thus the manufacturing cost of the display device can be reduced. In addition, the number of metal wirings necessary for the manufacture of a display device can be reduced compared to a conventional LED 111, and in accordance thereto, design of the display device can be made easy.

A display module according to the disclosure may be applied while being installed on a wearable device, a portable device, a handheld device, and various kinds of electronic products or electronic parts for which displays are needed as a single unit, or it may be applied to display devices such as a monitor for a personal computer (PC), a high resolution TV, signage, and an electronic display through a plurality of assembly arrangements as a matrix type.

Meanwhile, each of the components according to the aforementioned various embodiments of the disclosure (e.g., a module or a program) may consist of a singular object or a plurality of objects. Also, among the aforementioned corresponding sub components, some sub components may be omitted, or other sub components may be further included in the various embodiments. Generally or additionally, some components (e.g., a module or a program) may be integrated as an object, and perform the functions that were performed by each of the components before integration identically or in a similar manner.

Also, operations performed by a module, a program, or other components according to the various embodiments may be executed sequentially, in parallel, repetitively, or heuristically. At least some of the operations may be executed in a different order or omitted, or other operations may be added.

While embodiments of the disclosure have been shown and described, the disclosure is not limited to the aforementioned specific embodiments, and it is apparent that various modifications can be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. A light emitting diode (LED) comprising:
   a substrate;
   a first light emitting cell including a first n-type semiconductor layer, a first p-type semiconductor layer, a first light emitting layer and a first pixel electrode which respectively include a plurality of non-planar areas formed according to a plurality of protrusions facing upward with respect to the substrate, the first light emitting layer emitting a light of a first wavelength corresponding to a red color;
   a second light emitting cell including a second n-type semiconductor layer, a second p-type semiconductor layer, a second light emitting layer and a second pixel electrode which respectively include a planar area, the second light emitting layer emitting a light of a second wavelength different from the first wavelength of the light emitted from the first light emitting layer; and
   a common electrode commonly connected with the first light emitting cell and the second light emitting cell,
   wherein the first pixel electrode and the second pixel electrode independently connected with each of the first light emitting cell and the second light emitting cell, wherein the first light emitting cell and the second light emitting cell are separated horizontally by a region including a passivation layer, and wherein a first light emitting area of the first light emitting cell is larger than a second light emitting area of the second light emitting cell.

2. The LED of claim 1, wherein the first n-type semiconductor layer and the second n-type semiconductor layer are n-GaN layers, the first p-type semiconductor layer and the second p-type semiconductor layer are p-GaN layers, and the first light emitting layer and the second light emitting layer include InGaN having different composition ratios of In from each other.

3. The LED of claim 2, wherein the composition ratios of In of InGaN included in each of the first light emitting layer and the second light emitting layer are determined differently according to a difference of incorporation rates of In for an n-GaN layer including the plurality of non-planar areas and an n-GaN layer including a planar area.

4. The LED of claim 3, further comprising: a mask pattern formed inside the first n-type semiconductor layer, wherein the plurality of non-planar areas included in each of the first n-type semiconductor layer, the first p-type semiconductor layer, and the first light emitting layer included in the first light emitting cell are formed on a window area of the mask pattern.

5. The LED of claim 1, wherein the first light emitting cell and the second light emitting cell are divided horizontally by an etched area between the first light emitting cell and the second light emitting cell.

6. The LED of claim 5, further comprising:

a passivation layer formed on an area excluding the areas wherein the common electrode, the first pixel electrode, and the second pixel electrode are formed.

7. The LED of claim 1, further comprising:

a third light emitting cell including a third n-type semiconductor layer, a third p-type semiconductor layer, a third light emitting layer and a third pixel electrode which respectively include a plurality of non-planar areas; and wherein the third pixel electrode is independently connected with the third light emitting cell, wherein the plurality of non-planar areas included in the third light emitting cell are different from the plurality of non-planar areas included in the first light emitting cell, the third light emitting layer emits a light of a third wavelength that is different from the first wavelength of the light emitted from the first light emitting layer and the second wavelength of the light emitted from the second light emitting layer, and the common electrode is commonly connected with the first light emitting cell, the second light emitting cell, and the third light emitting cell.

8. The LED of claim 1, wherein the plurality of non-planar areas include at least one of crystal planes of which Miller indices are {11-22} and {10-11}.

* * * * *